United States Patent [19]
Nikoloff et al.

[11] Patent Number: 5,154,618
[45] Date of Patent: Oct. 13, 1992

[54] ELECTRICAL ASSEMBLY

[75] Inventors: Christo S. Nikoloff, Lititz; James P. Scholz, Mechanicsburg, both of Pa.

[73] Assignee: AMP Incorporated, Harrisburg, Pa.

[21] Appl. No.: 766,476

[22] Filed: Sep. 30, 1991

[51] Int. Cl.⁵ .................................. H05K 1/00
[52] U.S. Cl. ..................... 439/67; 439/639; 439/640; 439/65
[58] Field of Search ............ 439/376, 62, 65, 77, 439/67, 492, 498, 581, 63, 502–506, 638–640; 361/395, 398, 413–415, 417

[56] References Cited

U.S. PATENT DOCUMENTS

| | | | |
|---|---|---|---|
| 4,087,146 | 5/1978 | Hudson, Jr. ..................... | 339/17 F |
| 4,143,932 | 3/1979 | Boutros ........................... | 439/77 |
| 4,169,641 | 10/1979 | Olsson ............................ | 339/17 F |
| 4,181,386 | 1/1980 | Olsson ............................ | 339/17 F |
| 4,252,389 | 2/1981 | Olsson ............................ | 339/17 F |
| 4,252,392 | 2/1981 | Whiteman, Jr. ................. | 339/74 R |
| 4,334,728 | 6/1982 | Reynolds et al. ................ | 339/74 R |
| 4,367,006 | 1/1983 | Rehbogen, Jr. et al. ...... | 339/176 MF |
| 4,379,608 | 4/1983 | Olsson et al. ................... | 339/75 MP |
| 4,477,137 | 10/1984 | Ayer ................................ | 339/59 M |
| 4,634,195 | 1/1987 | Shoemaker ...................... | 339/17 F |
| 4,639,063 | 1/1987 | Mueller ........................... | 339/75 M |
| 4,640,562 | 2/1987 | Shoemaker ...................... | 339/17 F |
| 4,664,456 | 5/1987 | Blair, et al. ..................... | 339/14 P |
| 4,708,661 | 11/1987 | Morland et al. ................. | 439/581 |
| 4,773,032 | 9/1988 | Uehara et al. .................. | 364/709.04 |
| 4,781,601 | 11/1988 | Kuhl et al. ....................... | 439/77 |
| 4,812,133 | 3/1989 | Fleak et al. ..................... | 439/248 |
| 4,923,406 | 5/1990 | Bucknam ......................... | 439/77 |
| 4,987,516 | 1/1991 | Belanger, Jr. et al. .......... | 439/67 |

*Primary Examiner*—David L. Pirlot
*Attorney, Agent, or Firm*—Katherine A. Nelson

[57] ABSTRACT

An electrical assembly removably and blindly matable to a second assembly includes upper and lower subassemblies and an electrical subassembly connected therewith. Each of the upper and lower subassemblies has a cover and a circuit board with an electrical connector mounted thereto for releasably connecting to respective first and second ends of the electrical subassembly. The electrical subassembly includes first and second flexible connection means extending from the first and second ends to respective connections with a third electrical connector, the first and second flexible connection means interconnecting selected electrical contact means of the third connector to corresponding contact means in respective connectors of the upper and lower subassemblies. The third connector is mounted in a precise alignment along an engaging face of the first assembly such that contact means of the third connector are exposed along the first assembly engaging face, the third connector being configured to mate in a disconnectable manner with complimentary contact means of a complementary connector exposed along a corresponding engaging face of the second assembly upon said first and second assemblies being nested with each other.

3 Claims, 8 Drawing Sheets

ELECTRICAL ASSEMBLY

BACKGROUND OF THE INVENTION

This application relates to an electrical assembly and more particularly to an assembly that is removably and blindly matable to a further assembly.

BACKGROUND OF THE INVENTION

There is increasing use of electrical devices that are "cordless" that is, devices that use rechargeable batteries and the like. Such devices usually have a base assembly and a separable assembly that can be used at locations remote from the base assembly. The two assemblies need, however, to be electrically connected periodically so that the portable portion may be "recharged" for further use. Typical devices that use such a system are cordless hand tools such as, for example, drills and screwdrivers, etc. Such devices also include electronic devices such as telephones and other electronic equipment within which the internal electrical connections of the components are commonly soldered as is conventional Most of these devices are large enough so that electrical interconnection between the portable unit and base unit can be easily seen and therefore the units can be readily aligned. Such portable equipment generally has exposed contact areas that abuttingly engage low profile prongs of a base unit when recharging becomes necessary where the contact areas define a relatively large "target" area for engagement by the prongs reduces sensitivity to alignment.

Alignment of the mating members is more of a problem, however, for connectors whose contacts must become mated in conventional male-female relationship (i.e., pin and socket) requiring precise axial alignment if the location of the connectors that are to be mated can not be observed while the connectors are being mated. It is then necessary to rely on other means for properly aligning the mating parts. U.S. Pat. No. 4,664,456 discloses an integral alignment system of matable electrical connectors, wherein the connectors are to be mated remote from the ability of a person to manipulate the connectors into an aligned spatial and angular orientation. One of the connectors may be fixedly mounted such as to a rack at the rear of a drawer-receiving slot, and the other is float mounted to the back panel of a drawer insertable into the drawer-receiving slot of the rack. In U.S. Pat. 4,812,133, a connector is float mounted to a back panel so that it can accommodate the fixedly mounted connector as it is brought into engagement with the panel mounted connector. The need to provide precision alignment is even more important as the relative size of the mating members is decreased and the smaller contacts necessarily are less rugged.

The increasing interest in providing more compact portable electronic devices having various capabilities including the capability of receiving signals and power from a base unit as well as transmitting and receiving information in digital form. The need for and the space available for components as well as aligning means become more critical as the device becomes more sophisticated and the electronic components are miniaturized. Since the mating members of compact devices are miniature, the devices are particularly suitable for "blind mating".

It is desirable, therefore, to provide a means for precisely aligning the matable electrical connectors so that the electronic device is not damaged when the two assemblies are nested together.

It is further desirable that the assemblies be easily repairable and that the remote portion of the assembly in particular have easily disconnectable portions for purposes of repairability.

It is also desirable that the remote or the portable portion of the device have a rugged construction and be resistant to impact and physical shock from the forces placed against the internal electronic system when the portable assembly is nested into the base assembly.

The above requirements for blind mating, easy repairability, precise alignment and shock resistance are even more important as electrical devices become smaller and smaller. The smaller the exterior dimensions of the electrical device, the less room there is within the device to provide a means for protecting delicate electronic parts and their electrical connections.

SUMMARY OF THE INVENTION

The electrical device of the present invention includes a first assembly adapted to be removably electrically interconnected to a second assembly. The first assembly includes upper and lower subassemblies and an electrical subassembly connected with the upper and lower subassemblies. The upper subassembly includes a first cover, a first circuit board and a first electrical connector secured to the first circuit board and releasably connected to a first end of the electrical subassembly. The lower subassembly includes a second cover, a second circuit board and a second electrical connector for releasably connecting to a second end of the electrical subassembly. The electrical subassembly includes first and second flexible connection means extending from the first and second ends to respective connections with a third electrical connector mounted to the upper subassembly. The first flexible connection means interconnects selected electrical contact means of the third connector to corresponding contact means in the upper subassembly connector. The second flexible connection means interconnects other selected contact means of the third connector to corresponding contact means in the lower subassembly connector. The third connector is mounted in precise alignment along an engaging face of the first assembly such that the third connector mating face is exposed along the first assembly engaging face. The third connector is configured to mate in a disconnectable manner with a complimentary connector exposed along a corresponding engaging face of the second assembly when the first and second assemblies are engaged with one another. The configuration of the electrical subassembly is such that the first and second ends thereof are free from stress at their respective interconnections with the first and second electrical connectors of the upper and lower subassemblies.

It is a primary object of the present invention to provide a separable electronic device wherein first and second assemblies are blind matable and resistant to shock caused by impact during nesting of the assemblies.

It is a further object of the invention to provide a means for readily repairing the assemblies particularly the portable portion.

It is a further object of the invention to provide a rugged system for interconnecting two electrical assemblies.

It is also an object of the invention to provide a means for easily disconnecting various subassemblies within the major parts of the electrical device.

Some of the objects and advantages of the invention having been stated, others will become apparent from the following description when taken in conjunction with the accompanying drawings of an embodiment of the present invention by way of example.

DETAILED DESCRIPTION OF THE DRAWINGS

The present invention is directed to a means for interconnecting two electronic assemblies 12,102 each having a variety of components therein. The assemblies 12,102 are adapted for blind mating and the interconnection must be rugged so as to resist damage to electrical connections within the device owing to impact upon mating.

Figure 1:
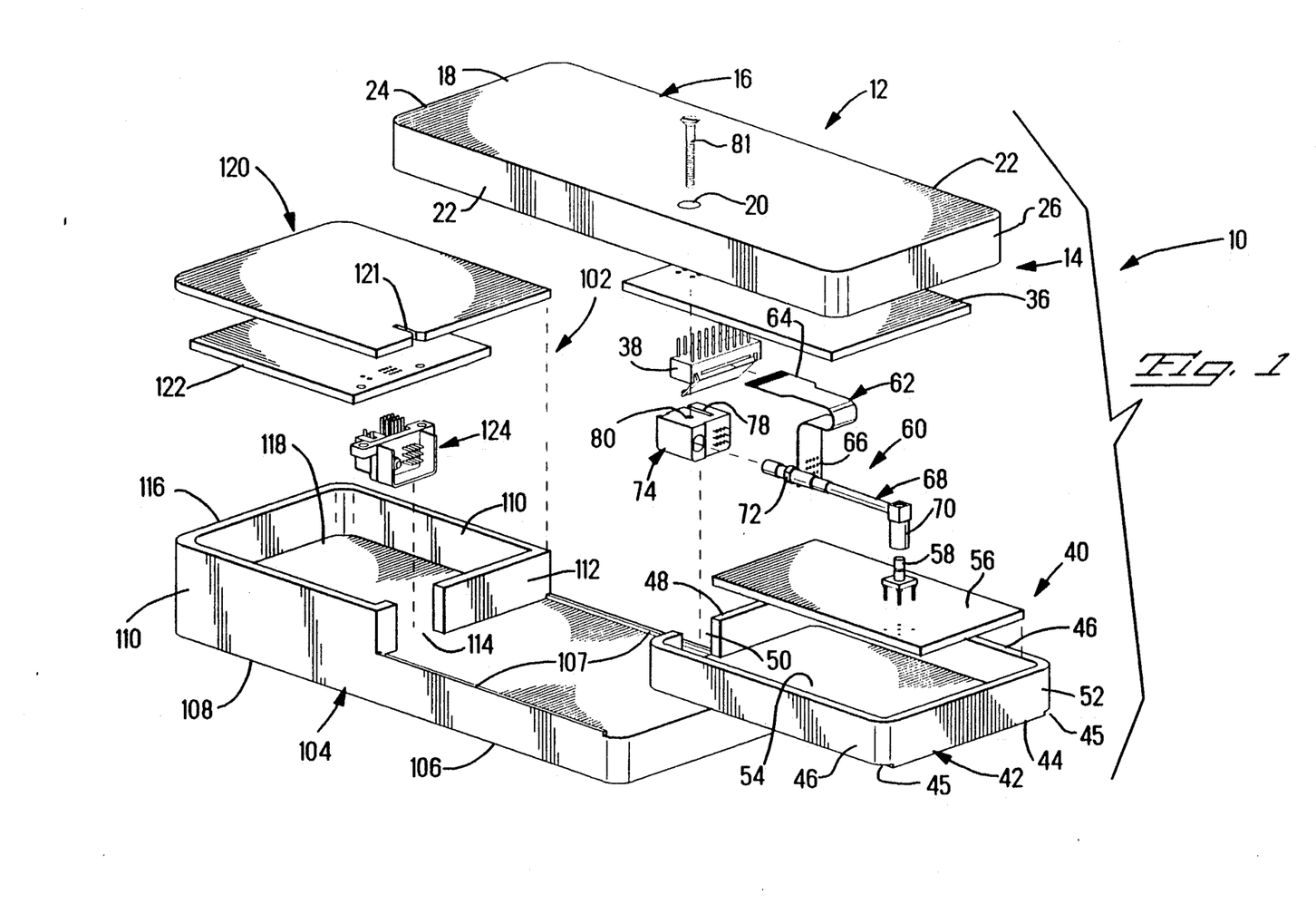
FIG. 1 is an exploded perspective view of an electronic device made in accordance with this invention.
Figure 2:
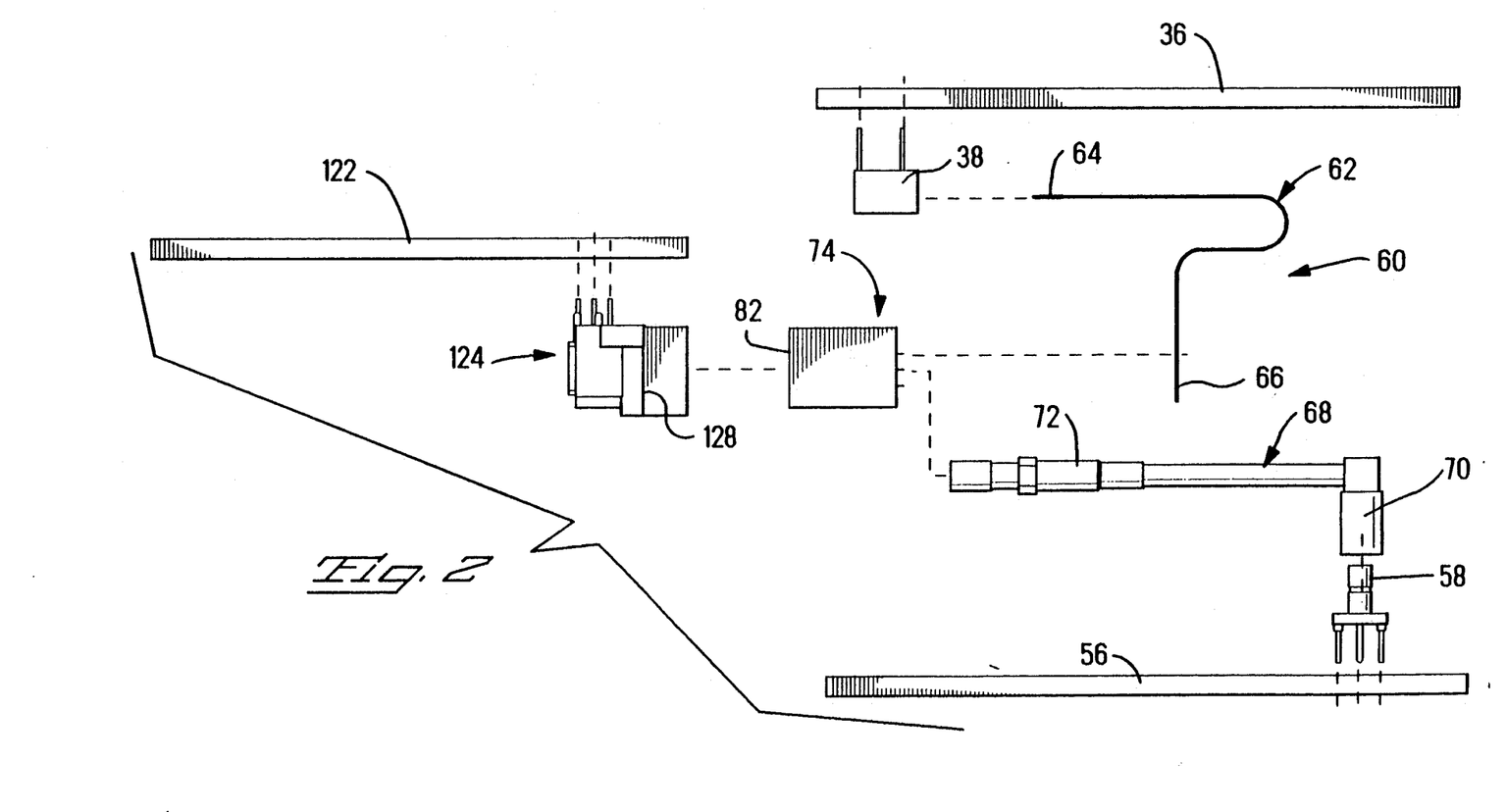
FIG. 2 is an enlarged pictorial representation of the device of FIG. 1 with the covers removed.
Figure 4:
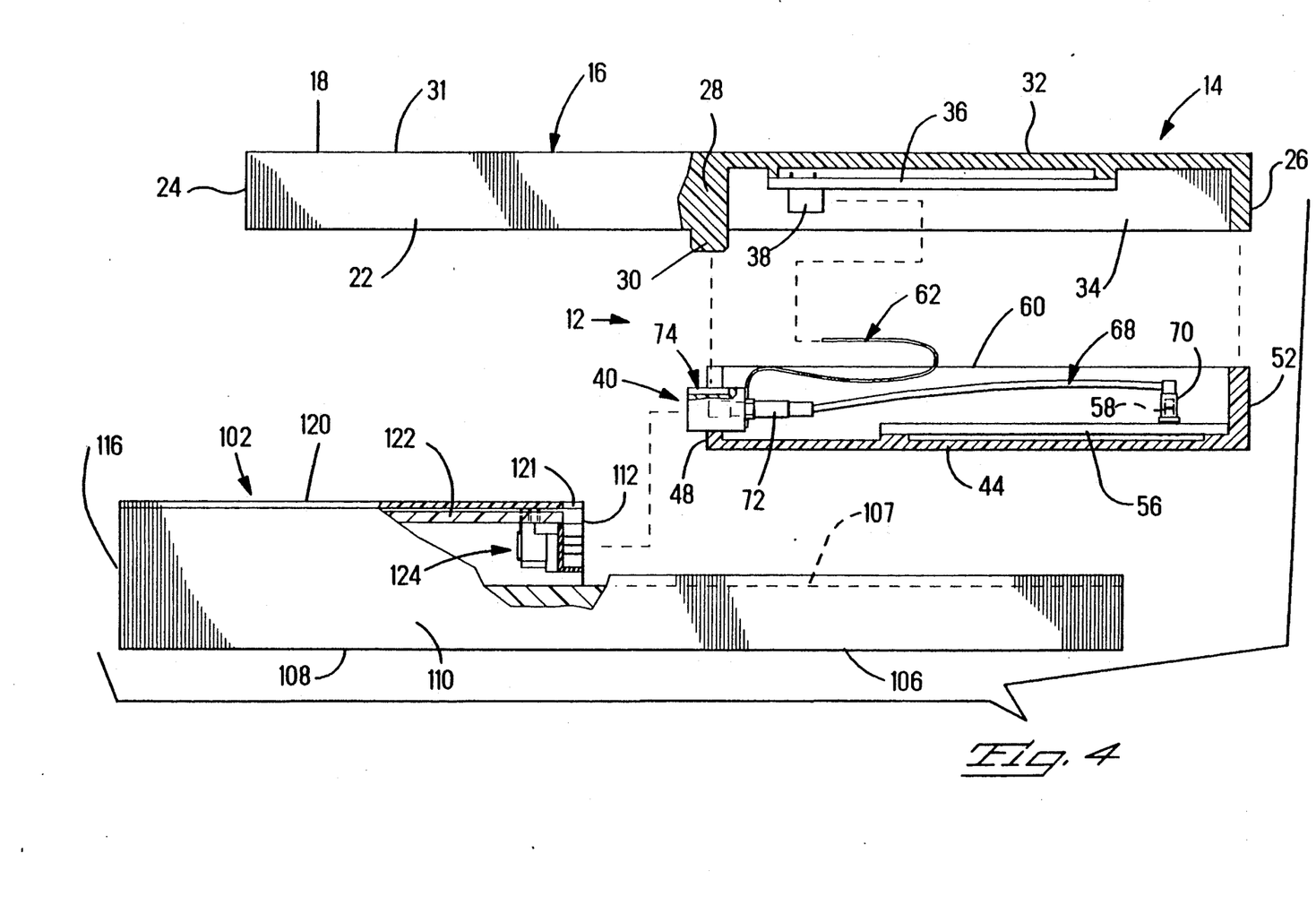
FIG. 4 is a partially assembled side view of the device having portions of the cover side walls removed.
Figure 5:
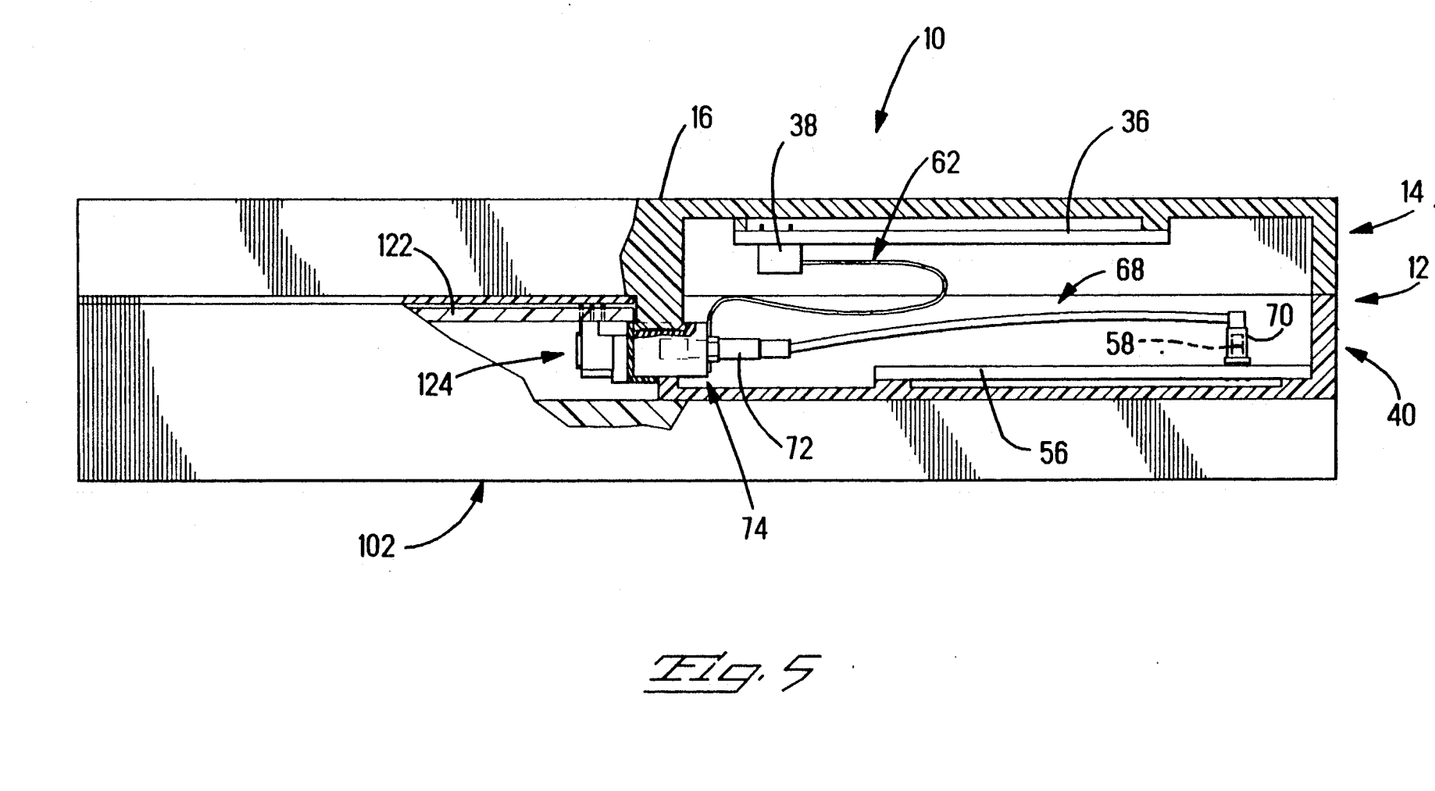
FIG. 5 is a side view of the assembled device of FIG. 1 with portions of the cover side walls broken away.

Referring now to FIGS. 1, 2 and 4 the electronic device 10 includes a first assembly 12 and a second assembly 102. First assembly 12 includes upper subassembly 14 and, lower subassembly 40 affixed together at an interface, and electrical subassembly 60 electrically connected to both. Upper subassembly 14 includes a first cover 16 having a top 18, opposed side walls 22, first and second end walls 24,26 and intermediate wall 28. As best seen in FIGS. 4 and 5, intermediate wall 28 divides the subassembly 14 into forward and rearward portions 31,32. Intermediate wall 28 further includes downwardly extending flange 30, which cooperates with means in the electrical subassembly to align connector 74 in assembly 12, as more fully described below. Rearward portion 32 includes a cavity 34 defined between intermediate wall 28 and second end wall 26 and portions of side walls 22. A first circuit board 36 having a first electrical connector 38 mounted thereto is disposed within cavity 34. First electrical connector 38 is adapted for releasably interconnecting with a first end 64 of electrical subassembly 60. First circuit board 36 includes a plurality of circuits and various electronic components (not shown). For purposes of understanding the invention, only first connector 38, which is used to interconnect the upper subassembly 12 to the second assembly 102, is shown. It is to be understood that the device in these figures is only representative of the various types of devices with which the present invention may be used.

Referring now to FIGS. 1, 4 and 5, the lower subassembly 40 includes a second cover 42 having a bottom 44, upwardly extending opposed side walls 46, a first assembly engaging face 48 and an end wall 52 defining cavity 54 therebetween. A second circuit board 56 having a second electrical connector 58 is disposed within cavity 54. Second electrical connector 58 is adapted for interconnection to a second end of electrical subassembly 60. Second circuit board further includes a plurality of circuits and components (not shown).

Referring now to FIGS. 1, 2, 3 and 4, electrical subassembly 60 includes first and second flexible connection means 62,68 and third electrical connector 74. First flexible connection means 62 has a first end 64 for releaseably interconnection with first electrical connector 38 of the first subassembly 12 and a second end 66 for electrical connection to selected contact means with third electrical connector 74. Second flexible connection means 68 includes a first end adapted for electrical connection with the lower subassembly connector 58 and a second end 72 adapted to be received in third electrical connector 74.

In the preferred embodiment, first flexible connection means 62 is a flat flexible cable having a plurality of conductors disposed between layers of dielectric film. A portion of the film has been removed at forward end 64 to expose the conductors for mating with contacts within connector 38. For purposes of appreciating the miniature size of the present invention, the cable conductors are on 1 mm (0.039") center line spacing, twelve (12) conductors, for example, occupy only 13 mm (0.512") and connector 38 is about 15 mm (0.590") wide.

Figure 3:
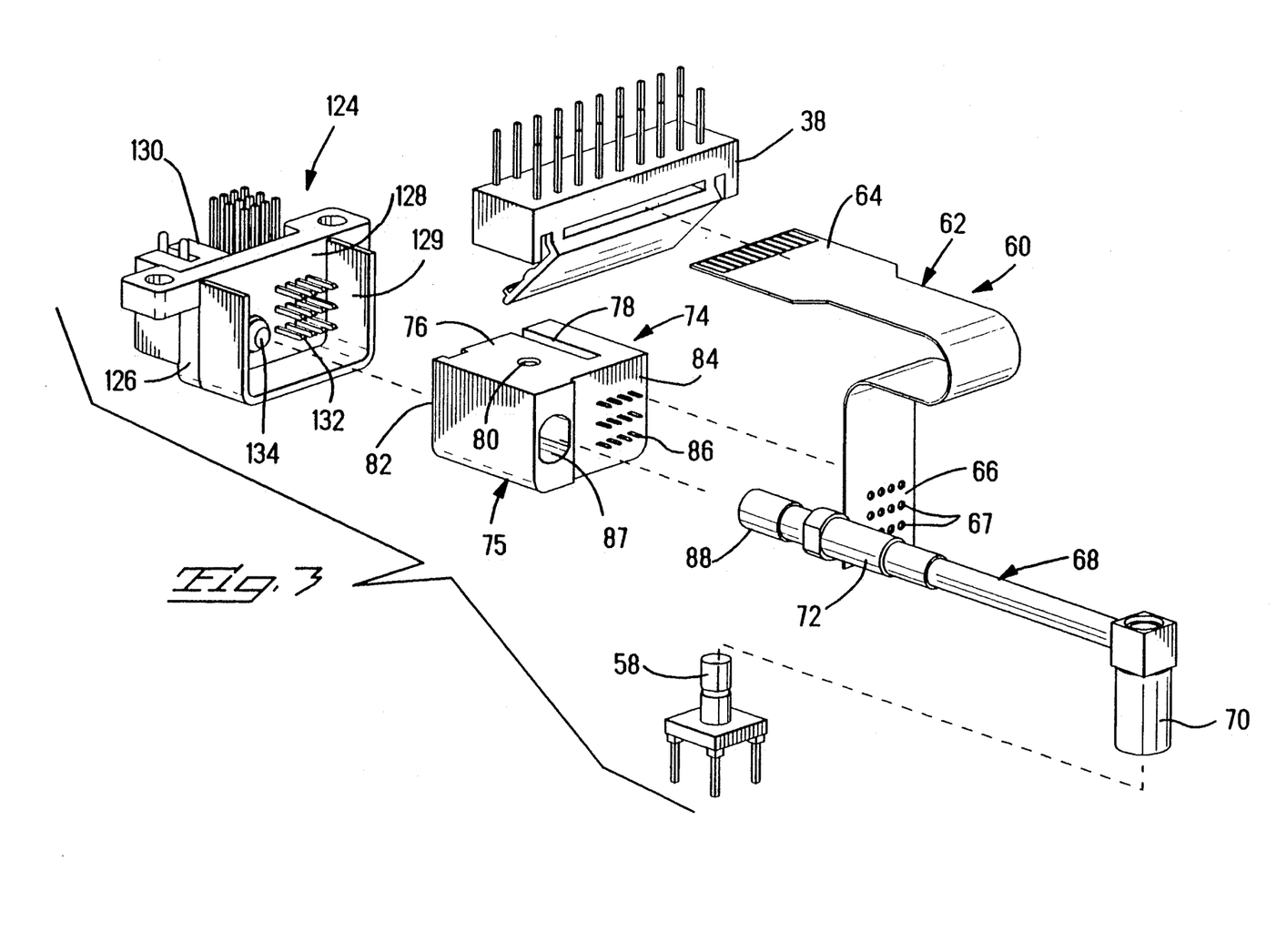
FIG. 3 is an enlarged view of the electrical subassembly of the device as shown in FIG. 1.

Third electrical connector 74 includes a housing 75 having an upper wall 76 and a mating face 82 and rear face 84, as best seen in FIG. 3. Upper housing wall 76 further includes a slot 78 extending rearwardly from the mating face 82 toward the rear face. Slot 78 is adapted to receive flange 30, which extends downwardly from first cover 16 of the upper subassembly 14 as best seen in FIG. 4. Housing 75 further includes an aperture 80 adapted for receiving mounting means 81, shown in FIG. 1, which extends through aperture 20 in first cover 16 and into housing 75 to hold third connector 74 in a precise location within the first assembly 12. As shown in FIGS. 1 and 4 the first assembly engaging face 48 of the lower subassembly 40 further includes an aperture 50 configured to receive third connector member 74 therein When assembled, the first assembly 12 holds the third connector 74 in a precise alignment for mating with a complimentary connector 124 of the second assembly. In the preferred embodiment, third connector 74 is a "hybrid connector", that is one that includes both signal and coaxial connections. Thus, signals can be transmitted through part of connector 74 and data in digital form can be transmitted through the other. As shown in FIG. 3 housing 75 further includes contact means 86 extending outwardly from rear face 84 and adapted to mate with the second end 66 of the first flexible connection means 62. As shown in this embodiment, end 66 includes a plurality of apertures 67 for receiving contact means 86. The corresponding conductors in end 66 are then mechanically secured and electrically connected by solder or other conductive means. Housing 75 further includes an aperture 87 for receiving connection means 88 attached to the end of the second flexible connection means 68. In this embodiment the second flexible connection means is shown as a coaxial cable having appropriate connection means on the first and second ends 70,72. In the preferred embodiment the first connector 38 secured in upper subassembly 14 is a zero insertion force connector (ZIF) or low insertion force (LIF) connector that releasably engages first end 64 of first flexible connection means 62. Suitable ZIF connectors for flat cable are disclosed in, for example, U.S. Pat. Nos. 4,477,137; and 4,334,728. The ZIF connector may be a type in which contact portions are mounted in through holes of the circuit board such as shown in the former patent or a surface mount connector such as shown in the latter patent.

FIGS. 4 and 5 illustrate a side view of the assembled first assembly 12. As can be seen from these figures, the third connector 74 is mounted and secured to the assembly in a manner to be mechanically independent of the first and second circuit boards 36,58 respectively. Thus when the connector 74 of the first assembly 12 is mated with connector 124 of the second assembly 102, the flexible connecting means 62,68 absorb the stresses caused by impact without placing stress on any soldered connections between first connector 38 and first circuit board 36 or second connector 58 and second circuit board 56. The second connector 74 is mechanically fastened by means 81 inserted through upper assembly cover 16, and aligned cover flange 30 and connector housing slot 78, and aperture 50 in lower assembly wall 48 such that the connector 74 is in precise alignment for engagement with the mating connector. Fastening means 81 and flange 30 also provide means to prevent rotation of connector 74. In assembling the device 10, the upper and lower subassemblies 14,40 are secured together by means (not shown) to form the first assembly 12. Manufacture of assembly 12 is facilitated by the use of releasable connectors 38,58 to the ends of the electrical subassembly 60. Owing to the compact design of the device and in particular assembly 12, makes soldering of all the connection extremely difficult. By using releasably connectors such as the ZIF connector 38 and a releasable coaxial connection 58, electronic subassembly 60 can be readily removed from the first assembly 12 for repair. In addition, the circuit board 36 and its corresponding components and circuit board 56 and its corresponding components may be easily removed from the respective upper and lower subassemblies 14,40 for repairability.

Referring now to FIGS. 1, 4 and 5, the second assembly 102 is comprised of a base 104 having forward and rearward portions 106,108 configured to receive the first assembly in an overlapping relation. The forward portion 106 of a second assembly 102 further includes alignment flanges 107 for engaging corresponding grooves 45 in lower subassembly 40 for precisely aligning the first and second assemblies 12,102 prior to engagement of the respective connectors, 74,124. The rearward portion 108 includes opposed upwardly extending sidewalls 110, second assembly engaging face 112 and rear wall 116 defining a cavity 118 for receiving a third circuit board 122 having a fourth connector 124 secured thereto. As is best seen in FIG. 1, second assembly engaging face 112 further includes an opening 114 therein configured to receive the fourth connector 124. As shown in FIG. 3, fourth connector or mating connector 124 has a housing 126 with a mating face 128 having a forwardly projecting shroud portion 129 together configured to receive the forward mating face 82 of third connector 74. Fourth connector 124 further includes first and second contact means 132,134 respectively. After the third circuit board 122 and connector 124 are received in cavity 118, third cover member 120 is secured to base 104 by means (not shown). Cover 120 further includes slot 121 therein for receiving the leading edge of flange 30 when the assemblies 12,102 are nested together.

Figure 6:
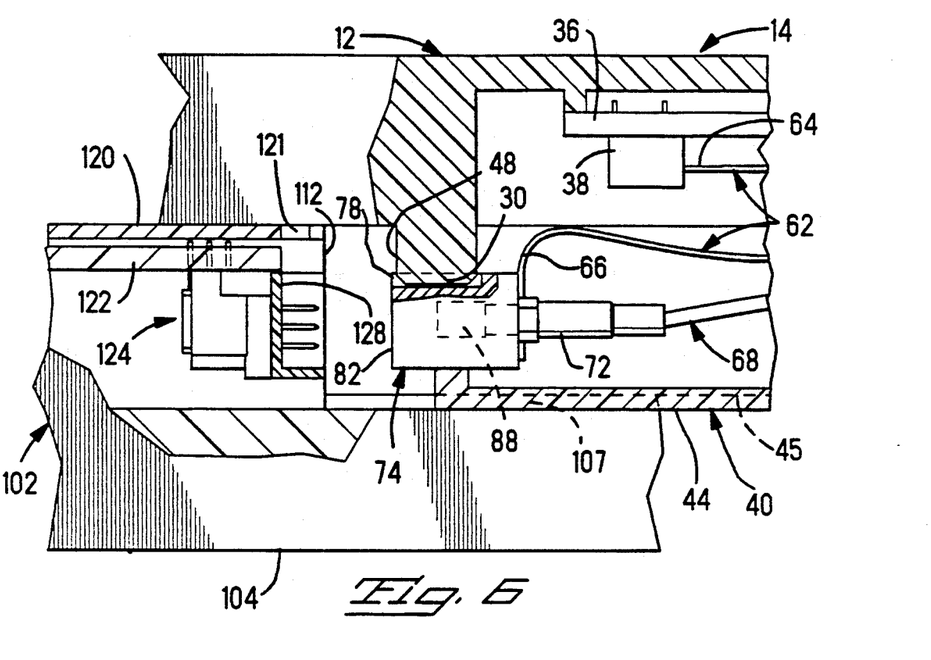
FIG. 6 is an enlarged fragmentary view of the mating faces of the two assemblies prior to mating.
Figure 7:
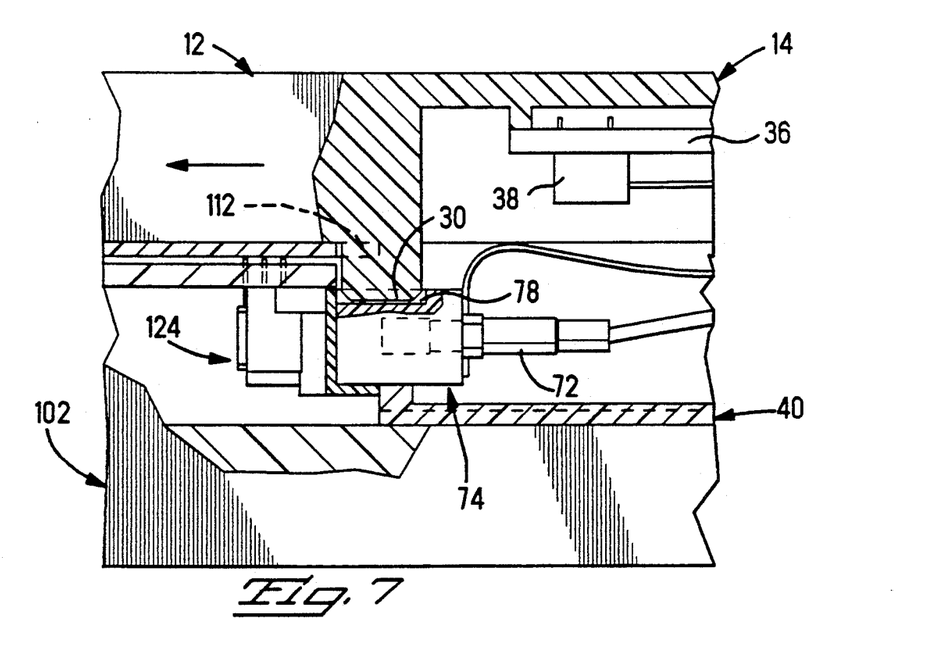
FIG. 7 is a view similar to FIG. 6 after the assemblies have been mated.
Figure 8:
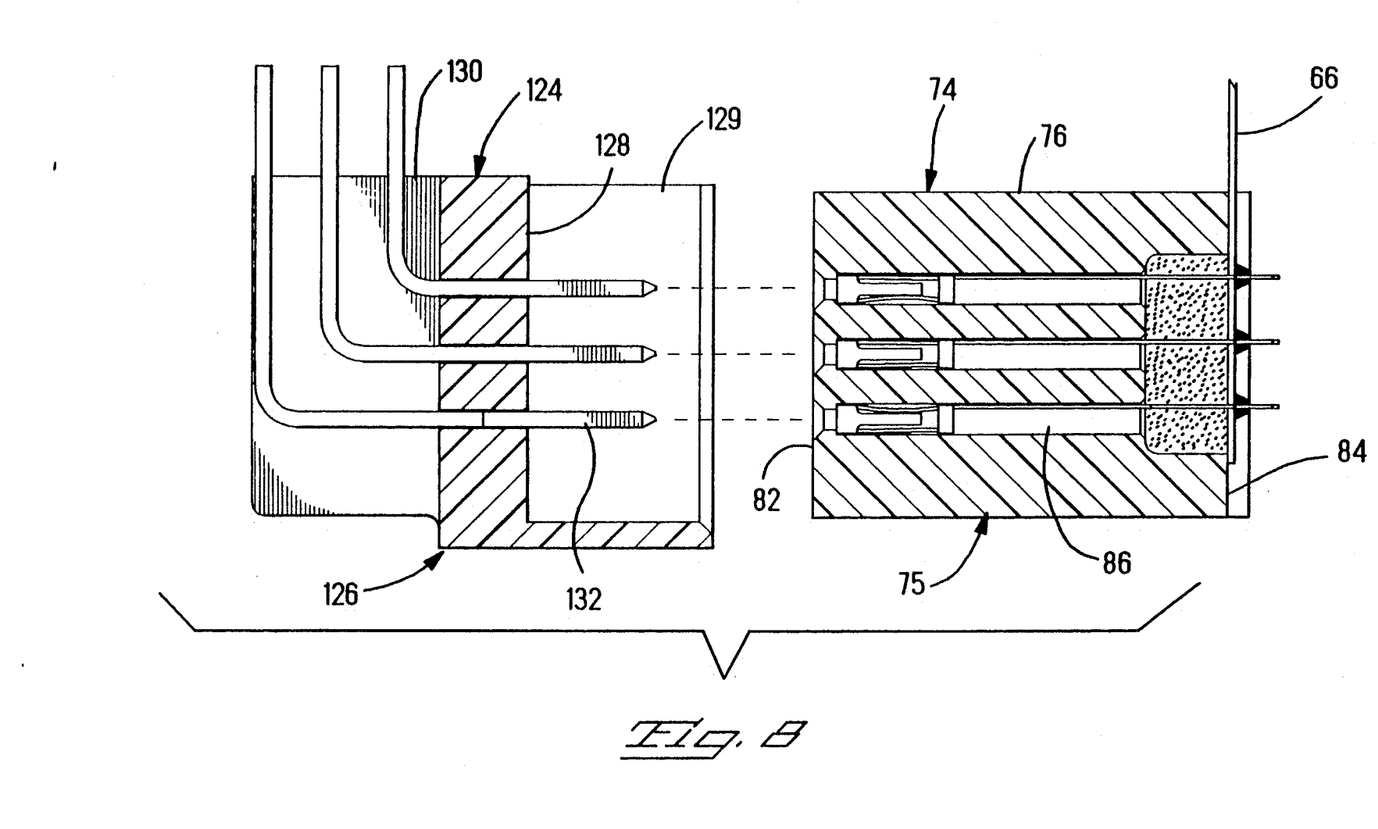
FIG. 8 is an enlarged fragmentary cross sectional view of the mating connector at the assembly engaging faces showing the portion of the connector interconnecting the upper subassembly circuits with corresponding circuits in the second assembly.
Figure 9:
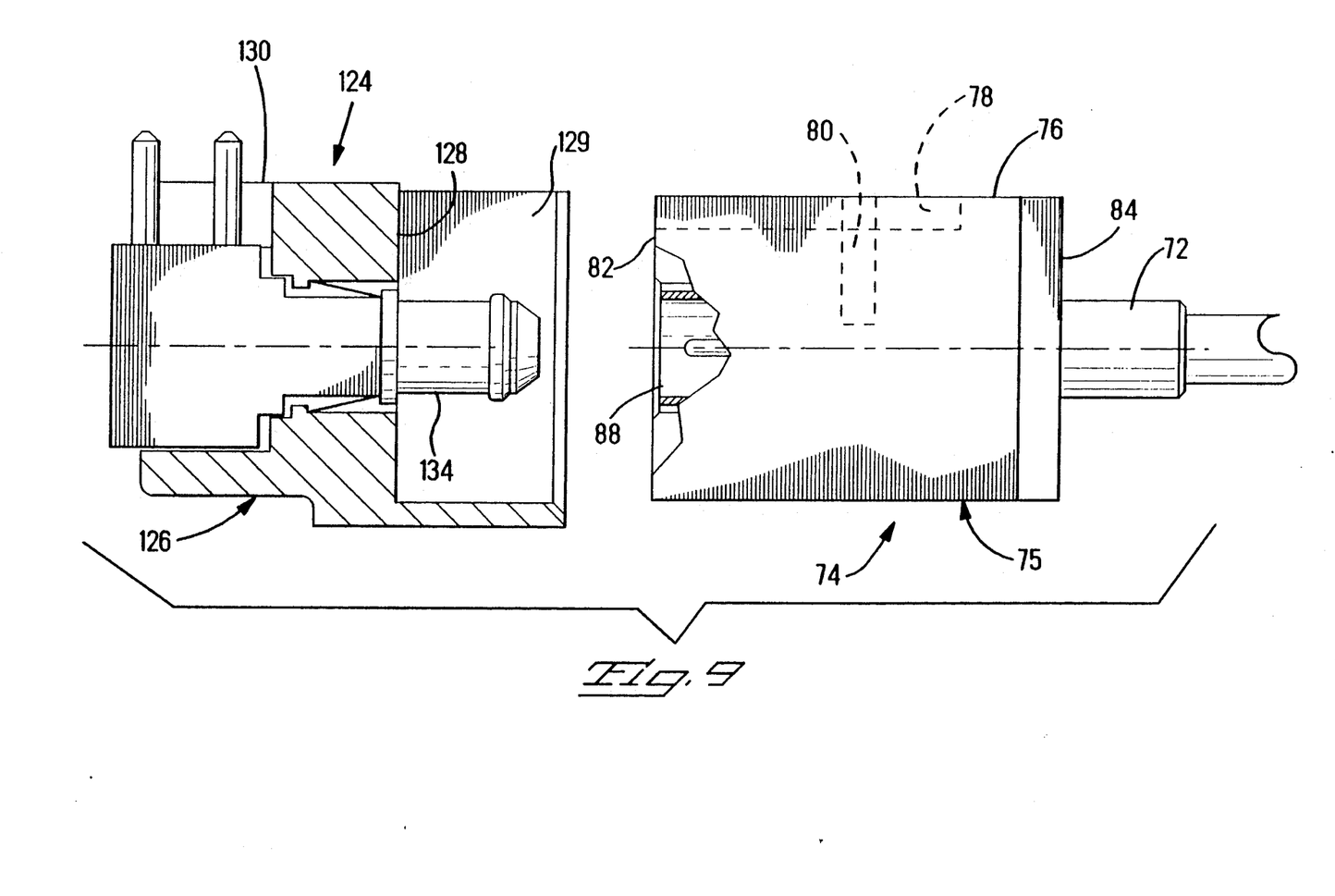
FIG. 9 is a view similar to that of FIG. 8 showing the electrical interconnection of the circuitry in the lower subassembly with the corresponding circuitry of the second assembly.

The interconnection of the first and second assemblies 12,102 is best understood by referring to FIGS. 5, 6 and 7. FIG. 6 shows an enlarged view of the first and second assembly engaging faces 48,112 and the corresponding third and fourth connectors 74,124. As the first and second assemblies 12,102 are brought together, alignment flanges 107 of assembly 102 engage undercut surfaces 45 of assembly 12 in a closely interfitting manner, and the corresponding contact means 86 that are electrically connected to the first subassembly 14 through cable ends 66 are brought into alignment and electrical engagement with contact means 132 of connector 124 as best seen in FIG. 8. Concomitantly therewith the contact means 88 electrically connected to lower subassembly 40 by second flexible means 68 engage the second contact means 134 of fourth connector member 124 as shown in FIG. 9. Interconnection is completed as the two assemblies 12,102 are fully nested together. When the assemblies 12,102 are nested, signals can be transmitted between assembly 102 and first circuit board components via first flexible means 62 and digital information can be transmitted between the assemblies 12,102 via second flexible means 68.

Since the third electrical connector 74 is not rigidly secured to either of the circuit boards 36,56 of the upper and lower subassemblies 14,40 the forces generated during the mating of the first and second assemblies 12,102 are not transmitted to any soldered interconnections of the respective connectors 38,58 with their respective circuit boards. Thus the stress on any solder connections of the board is essentially eliminated. As is shown in FIGS. 5, 6 and 7 the third connector 74 is secured in position by the flange 30 of upper cover 16 to secure and orient the connector 74 for precise alignment with the mating connector 124. The connector 74 is further held securely to the cover 16 by the screw member (not shown in FIG. 5).

The present invention provides a means whereby two assemblies can be repeatedly, and reliably blind mated without causing undue stress on any solder connections. The present invention furthermore provides a means whereby various electronic portions of the assembly can be readily assembled and easily disconnected from other portions and repairs can be effected to one portion without having to replace the entire assembly. The device is therefore more cost effective to make, assemble and repair.

It is thought that the electrical assembly of the present invention and many of its attendant advantages will be understood from the foregoing description. It is will apparent that various changes may be made in the form, construction and arrangement of the parts thereof without departing from the spirit or scope of the invention or sacrificing all its material advantages. The form herein described is merely a preferred or exemplary embodiment thereof.

We claim:

1. A first assembly adapted to be removably electrically interconnected to a second assembly, said first assembly comprising:

an upper subassembly, a lower subassembly affixed thereto and an electrical subassembly connected with said upper and lower subassemblies together comprising said first assembly;

said upper subassembly including a first cover and a first circuit board having a first electrical connector for releasably connecting to a first end of said electrical subassembly;

said lower subassembly including a second cover and a second circuit board having a second electrical connector for releasably connecting to a second end of said electrical subassembly; and said electrical subassembly including first and second flexible connection means extending from said first and second ends to respective connections with a third electrical connector, said first flexible connection means interconnecting selected electrical contact means of said third connector to corresponding contact means in said upper subassembly connector and said second flexible connection means interconnecting other selected contact means of said third connector to corresponding contact means in said lower subassembly connector, said third connector further having contact means at least exposed across a mating face thereof, said third connector being mounted in a precise alignment along an engaging face of said first assembly such that the third connector mating face is exposed along the first assembly engaging face, the third connector being configured to mate in a disconnectable manner with complementary contact means of a complementary connector exposed along a corresponding engaging face of said second assembly upon said first and second assemblies being engaged with each other, said electrical subassembly being and adapted for connection of the first and second ends thereof and being free of stress resulting from the force of mating, whereby when said first and second assemblies are brought into alignment with one another and urged together, the corresponding contact means of said third connector and said complementary connector are electrically engaged, the electrical connections between the corresponding first and second circuit boards, the first and second connectors and the first and second connecting ends of the electrical subassembly are essentially free of stress resulting from the force of mating.

2. The assembly of claim 1 wherein said first flexible connection means is a flat flexible cable.

3. The assembly of claim 1 wherein said second flexible connection means is a coaxial cable.

* * * * *

UNITED STATES PATENT AND TRADEMARK OFFICE
CERTIFICATE OF CORRECTION

PATENT NO. : 5,154,618
DATED : 10/13/92
INVENTOR(S) : James P. Scholz et al.

It is certified that error appears in the above-identified patent and that said Letters Patent is hereby corrected as shown below:

In the Claims:

Claim 1, Column 7, Line 5 - a comma should be inserted after "subassembly";

Claim 1, Column 7, Line 6 - a comma should be inserted after "subassemblies";

Claim 1, Column 8, Line 11 - the word "and" should be deleted

Signed and Sealed this

Twenty-sixth Day of October, 1993

Attest:

BRUCE LEHMAN

Attesting Officer

Commissioner of Patents and Trademarks